US008976335B2

(12) United States Patent
Beerens et al.

(10) Patent No.: US 8,976,335 B2
(45) Date of Patent: Mar. 10, 2015

(54) LITHOGRAPHIC APPARATUS AND REMOVABLE MEMBER

(75) Inventors: Ruud Antonius Catharina Maria Beerens, Roggel (NL); Theodorus Petrus Maria Cadee, Vlierden (NL)

(73) Assignee: ASML Netherlands B.V., Veldhoven (NL)

(*) Notice: Subject to any disclaimer, the term of this patent is extended or adjusted under 35 U.S.C. 154(b) by 436 days.

(21) Appl. No.: 13/333,237

(22) Filed: Dec. 21, 2011

(65) Prior Publication Data

US 2012/0162621 A1 Jun. 28, 2012

Related U.S. Application Data

(60) Provisional application No. 61/426,627, filed on Dec. 23, 2010.

(51) Int. Cl.
*G03F 7/20* (2006.01)
*H01L 21/683* (2006.01)
*H01L 21/687* (2006.01)

(52) U.S. Cl.
CPC .......... *G03F 7/70875* (2013.01); *H01L 21/683* (2013.01); *G03F 7/70716* (2013.01); *H01L 21/6875* (2013.01)
USPC ................ 355/72; 310/12.06; 355/30; 355/77

(58) Field of Classification Search
CPC ............ G03F 7/70716; G03F 7/70858; G03F 7/70866; G03F 7/70875; H01L 21/683; H01L 21/687; H01L 21/68714; H01L 21/6875
USPC ............. 310/12.05, 12.06, 12.29; 355/30, 53, 355/72, 73, 75–77
See application file for complete search history.

(56) References Cited

U.S. PATENT DOCUMENTS

| | | | |
|---|---|---|---|
| 7,532,310 B2 | 5/2009 | Mertens et al. | |
| 2005/0046017 A1 | 3/2005 | Dangelo | |
| 2005/0224220 A1 | 10/2005 | Li et al. | |
| 2006/0033898 A1* | 2/2006 | Cadee et al. | 355/53 |
| 2006/0102849 A1 | 5/2006 | Mertens et al. | |
| 2007/0153244 A1* | 7/2007 | Maria Zaal et al. | 355/30 |
| 2009/0060688 A1* | 3/2009 | Asada | 414/217 |
| 2010/0299918 A1 | 12/2010 | Oda | |
| 2011/0032678 A1 | 2/2011 | Altman et al. | |
| 2011/0222032 A1* | 9/2011 | Ten Kate et al. | 355/30 |
| 2011/0222033 A1* | 9/2011 | Ten Kate et al. | 355/30 |

FOREIGN PATENT DOCUMENTS

| | | |
|---|---|---|
| CN | 1804725 | 7/2006 |
| JP | 2001-319865 | 11/2001 |
| JP | 2010-103397 | 5/2010 |
| JP | 2010-278281 | 12/2010 |
| JP | 2011-060944 | 3/2011 |
| WO | 2010/133189 | 11/2010 |

OTHER PUBLICATIONS

"Lithographic apparatus with improved clamping capabilities," Research Disclosure Journal, Research Disclosure Database No. 537002, pp. 1-3 (Jan. 2009).
Korean Office Action mailed Jun. 27, 2013 in corresponding Korean Patent Application No. 10-2011-0140271.

* cited by examiner

*Primary Examiner* — Colin Kreutzer
(74) *Attorney, Agent, or Firm* — Pillsbury Winthrop Shaw Pittman LLP

(57) ABSTRACT

A lithographic apparatus arranged to transfer a pattern from a patterning device onto a substrate, the lithographic apparatus having a first object and a planar member mounted on the first object to improve thermal transfer to/from a second object.

21 Claims, 3 Drawing Sheets

LITHOGRAPHIC APPARATUS AND REMOVABLE MEMBER

This application claims priority and benefit under 35 U.S.C. §119(e) to U.S. Provisional Patent Application No. 61/426,627, filed on Dec. 23, 2010. The content of that application is incorporated herein in its entirety by reference.

FIELD

The present invention relates to a lithographic apparatus and a removable member for improving thermal transfer to/from an object of or in a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to impart a beam of radiation with a pattern in its cross-section, the pattern corresponding to a circuit pattern to be formed on an individual layer of the IC. This pattern can be imaged or transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an image of the entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In a lithographic apparatus, a substrate is placed on a substrate table. Usually the substrate is placed on a burl plate which is attached to the substrate table. The burl plate comprises a plurality of burls which are projections on which the substrate sits. Therefore, there its a gap between the substrate and a surface of the burl plate between the burls.

The substrate is thermally conditioned by means of a global substrate table conditioning system. Such a conditioning system usually uses a fluid as a heat transfer medium to keep the temperature of the substrate table substantially constant.

SUMMARY

Overlay and focus specifications require accurate substrate thermal conditioning. However, this can be difficult. For example, a dry lithographic apparatus has a difficulty with hot spots on a substrate due to heating up by the projection beam. For example, an immersion lithographic apparatus has a difficulty with cold spots due to evaporation. For example, an extreme ultraviolet (EUV) radiation lithographic apparatus has a difficulty because of the presence of a vacuum.

A way of dealing with the possibility of localized heating or cooling of the substrate is by depositing one or more heaters/sensors on the burl plate between the burls for thermal sensing and heating. Both sensors and heaters can be local in nature, meaning that they cover only a localized area of the substrate, in plan. Each heater/sensor combination is controlled individually thereby obtaining local thermal conditioning. Electrical contact between the burl plate and the remainder of the substrate table may be achieved by means of a flexible contact.

Other objects in a lithographic apparatus also require thermal conditioning, desirably thermal conditioning which can take account of local variations in heating/cooling. For example, one or more lenses of the lithographic apparatus could benefit from such a system.

It is desirable, for example, to provide an apparatus to thermally condition an object in a lithographic apparatus.

According to an aspect, there is provided a lithographic apparatus arranged to transfer a pattern from a patterning device onto a substrate, comprising a member to improve thermal transfer to/from an object.

According to an aspect, there is provided a lithographic apparatus arranged to transfer a pattern from a patterning device onto a substrate, comprising: a first object; a plurality of carbon nanotubes extending towards the first object with an axis substantially aligned with a direction perpendicular to a surface of the first object so as to improve thermal transfer to/from the first object.

According to an aspect, there is provided a removable member to improve thermal transfer to/from an object of, or in, a lithographic apparatus, the removable member comprising at least one heater and at least one temperature sensor.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
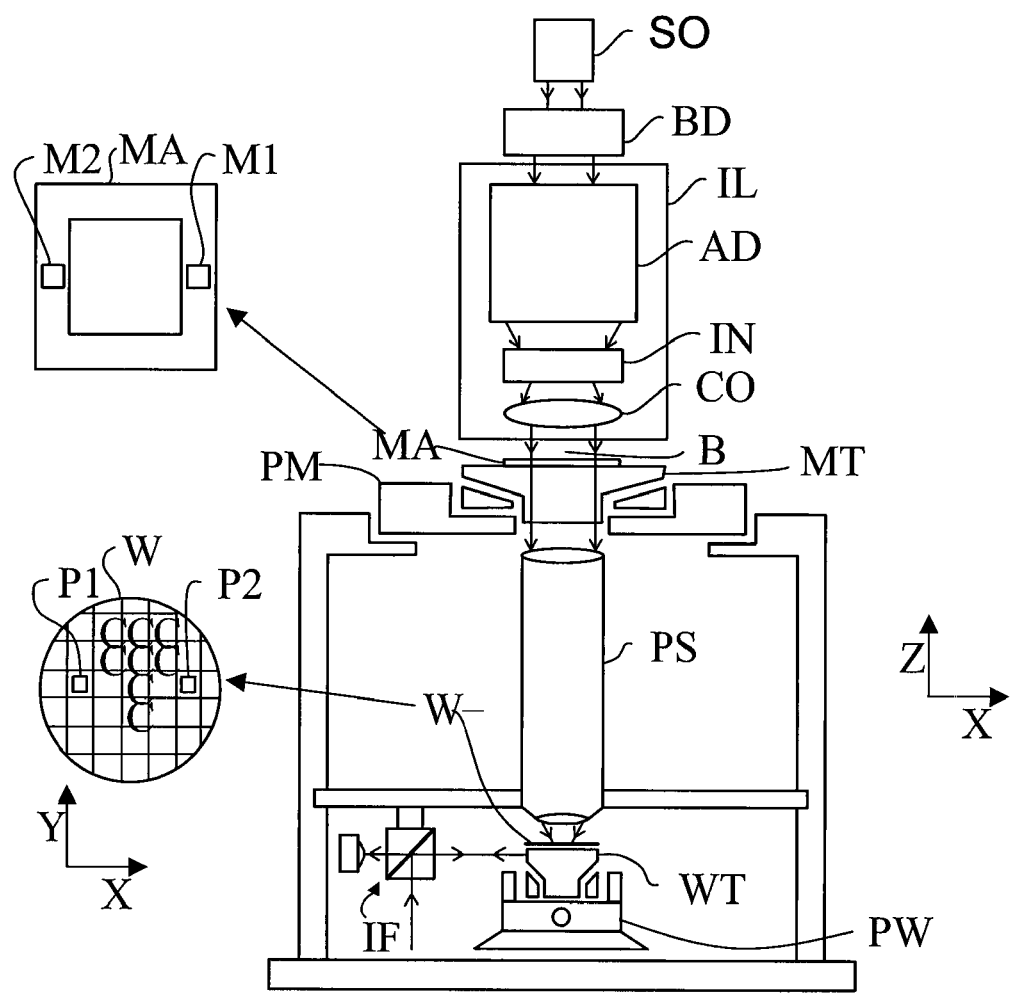
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or EUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT supports the patterning device. It holds the patterning device in a manner that depends on the orientation of the patterning device, the design of the Lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out or one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Embodiments of the present invention will be described in detail in connection with its use in conditioning a substrate W of a lithographic apparatus. However, an embodiment of the invention may be applied to any other object of, or in, a lithographic apparatus. Examples include a lens, a mask, a table (e.g. substrate table), or any other object or group of objects that requires conditioning.

An embodiment of the present invention is directed at improving thermal transfer to/from the object whose temperature is being conditioned. Prior temperature conditioners often leave a gap between a temperature sensor/heater and the object whose temperature is being conditioned. For example, in the case of a substrate W, one or more heater/sensor 12, 14 combinations may be provided between burls 25 of a burl plate 20 underneath the substrate W. However, a gap is maintained between the top of the heater/sensor 12, 14 combination and the bottom of the substrate W. That is, the heater/sensor 12, 14 combination is formed, for example as lines of a thin film, on the surface of the burl plate 20 between the burls 25 with a thickness less than the height of a burl 25. Such a system is limited in performance due to the length of the thermal path (more specifically, the thermal resistance) between the heater/sensor 12, 14 combination and the object which is being thermally conditioned. Therefore, such systems are typically slow in correcting thermal variance in the object. Additionally, yield is limited because of the surface properties of the surface of the burl plate 20 between burls 25.

In an embodiment a planar member 10 is provided. The member 10 is flat. The member 10 is elongate in directions of a plane. The member 10 is two dimensional. This allows the member 10 to be spread over a surface to be conditioned.

The planar member 10 is mounted on a first object of the lithographic apparatus (for example the burl plate 20). The planar member 10 comprises a material or materials which improve thermal transfer to/from the second object (for example the substrate W). The heat may be transferred to/from the first object (e.g. the burl plate 20) or from at least one heater 12. The heater 12 may be integral with or attached to or separate from the planar member 10, or the first object.

In an embodiment the heater 12 acts as a heat sink to cool the object. When less heat needs to be disposed of, the temperature of the heater can be increased. Such a system can be employed in a dry or EUV apparatus where hot rather than cold spots are likely to be generated.

The member 10 need not be planar. That is an advantage of using a thin film and/or (in combination with) carbon nanotubes as described below. If the member has a low stiffness it may be formed around surfaces (e.g. curved surfaces) of the object whose temperature the member regulates.

The planar member 10 may be separate from the burl plate 20. In one embodiment the planar member 10 is removable from the burl plate 20. Therefore, the planar member 10 may be manufactured with a well-conditioned surface to improve yield in terms of application of the one or more heaters and temperature sensors 12, 14 (e.g. in the form of a conducting path e.g. as tracks or lines of thin film deposited by a thin film technique) which can be applied to the planar member 10.

Figure 2:
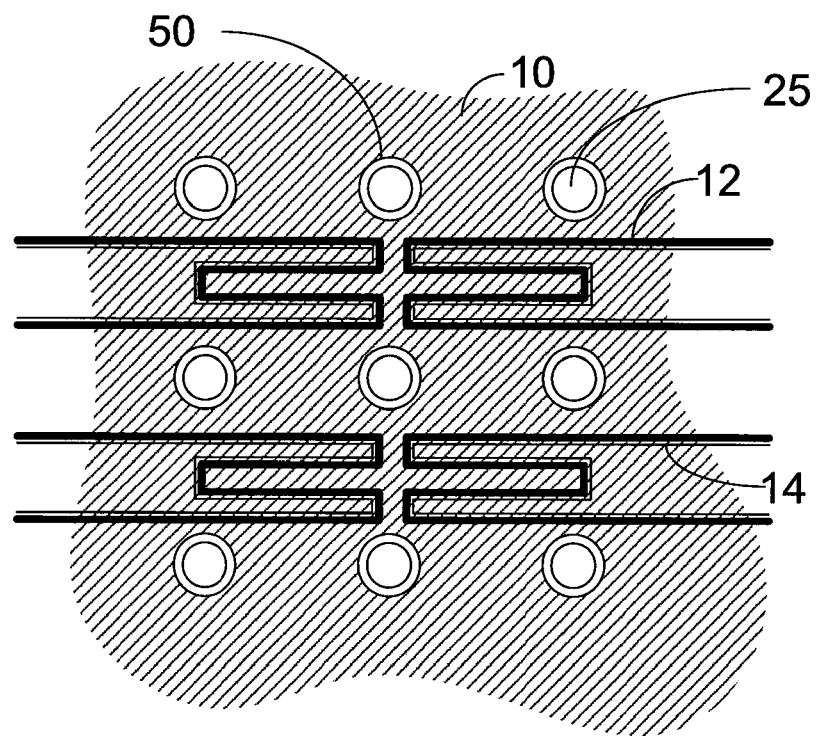
FIG. 2 depicts a burl plate and planar member, in plan.

FIG. 2 illustrates, in plan, a planar member 10 mounted on a burl plate 20 with a plurality of burls 25. As can be seen, the planar member 10 comprises heaters 12 in the form of tracks and temperature sensors 14 in the form of tracks. A heating track and a sensing track forms a heater and a temperature sensor combination.

The planar member 10 may comprise more than one heater 12 and/or temperature sensor 14. Each heater 12 and/or temperature sensor 14 may be confined to a localized area, in plan, of the planar member 10. In one embodiment each heater 12 has a corresponding temperature sensor 14. In one embodiment the corresponding heater 12 and temperature sensor 14 may be comprised of a single track (e.g. with a driver to drive the track alternately as a heater and a temperature sensor).

As illustrated in FIG. 2, the planar member 10 may comprise a plurality of throughholes 50. Burls 25 of the burl plate 20 project through the throughholes 50.

An advantage of the planar member 10 being removable is that when it ceases to function properly, for example because one of more heater and/or sensor tracks are defective, the planar member 10 can be removed and easily replaced. Additionally or alternatively, the planar member 10 may become contaminated with particles, for example from the underside of the substrate W. Such particles may embed themselves in the planar member 10. The planar member 10 may be removed for cleaning or may be removed and discarded and replaced with a new planar member 10.

Figure 3:
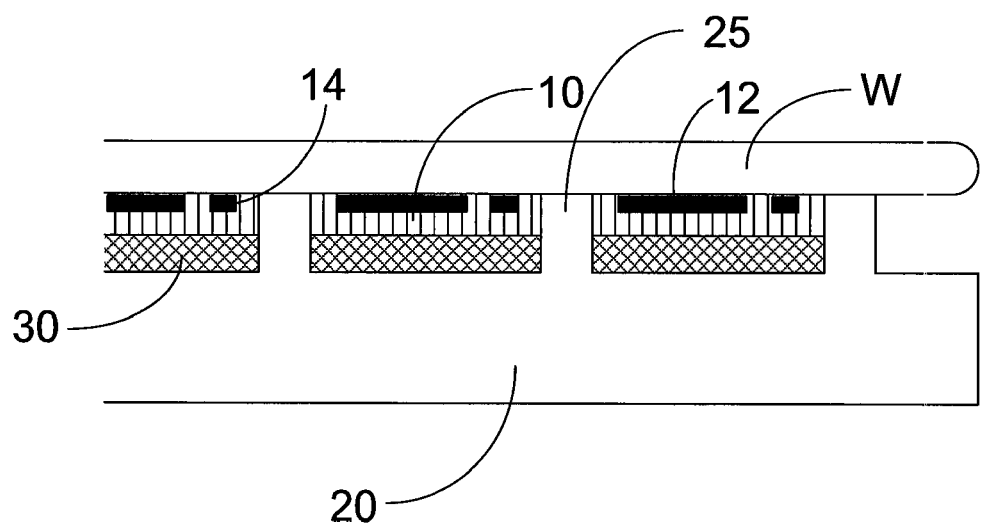
FIG. 3 depicts, in cross-section, a burl plate and planar member, in plan.

FIG. 3 illustrates the planar member 10 in cross-section. As can be seen, the top surface of the planar member 10 is made, in use, to be substantially parallel with a top surface of the burls 25. In this way the undersurface of the substrate W is in contact with the planar member 10, in use.

In one embodiment a resilient member 30 may be provided in the space between the burls 25 underneath the planar member 10. The resilient member 30 may be part of the planar member 10 or may be a separate component. The planar member 10 and/or resilient member 30 is dimensioned such that when the substrate W is not in place on the burl plate 20 the Lop surface of the planar member 10 projects above the top surface of the burls 25. When the substrate W is placed onto the burls 25 and a clamping force is applied to the substrate W (e.g. electrostatically or by an underpressure being generated in the space between the burls 25), the elasticity of a member, for example the planar member 10 and/or resilient member 30, results in the top surface of the planar member 10 being pressed into contact with the bottom surface of the substrate W. This has an advantage of contamination not affecting the flatness of the substrate W as the member will deform to accommodate the contamination.

An advantage of providing a resilient member 30 is the mechanical support which the combination of resilient member 30 and planar member 10 provides to the substrate W between the burls 25.

In one embodiment it is the elasticity of the resilient member 30 which results in the planar member 10 being pressed into contact with the substrate W. In one embodiment, the member 30 which presses the planar member 10 into contact with the second object: (e.g., the substrate W) due to its elasticity has a Young's modulus of less than 8000 MPa, desirably less than 6000, 4000 or 3000 MPa.

In one embodiment the resilient member 30 comprises a foam substrate, for example a polyurethane foam substrate or carbon nanotubes.

In one embodiment the foam is a closed cell foam. This embodiment may be particularly suited to the case where the substrate table WT is an electrostatic clamp or in an EUV apparatus.

In one embodiment the foam is an open cell foam. This may be particularly suitable where the substrate table WT is of the type which uses an underpressure between the burls 25 to clamp the substrate W to the burl plate 20 or to the case where the lithographic apparatus places the substrate W and substrate table WT in a vacuum.

In an embodiment the planar member 10 is not in contact with the substrate W. That is, there is a gap between the planar member 10 and the substrate W. This may have an advantage in some situations. For example, the risk of scratching of the undersurface of the substrate W and therefore generation of contaminant particles is reduced in this embodiment. However, the embodiment still has an advantage of providing the one or more heaters 12 and sensors 14 closer to the underside of the substrate W to improve thermal transfer to/from the substrate W. Additionally, if the planar member 10 is not removable, this also deals with contamination issues because contaminants will fall onto the planar member 10 between the burls 25 and will not contact the undersurface of the substrate W. Additionally or alternatively, this embodiment may be useful in the case that the substrate table WT operates using an underpressure between the burls 25. This is because there will then be enough space between the burls 25 to achieve the desired underpressure. Otherwise it may be necessary to ensure that the planar member 10 and/or resilient member 30 are porous.

In one embodiment the planar member 10 and the resilient member 30 are unitary and both form part of the planar member 10, which may be removable. In one embodiment the resilient member 30 is attached, for example by glue, to the burl plate 20 and the planar member 10 is simply placed on the resilient member 30 but not attached thereto.

An embodiment of the present invention increases the effective thermal area of the substrate W significantly. Without the planar member 10, thermal conditioning may be realized mostly by conduction through the burls 25. In an embodiment of the present invention, the usual fluid conditioning of the substrate table WT and thus thermal transfer through the burls 25 may also be present. However, the use of the planar member 10 increases thermal transfer to/from the substrate W, particularly when the planar member 10 is pressed against the undersurface of the substrate W. Even if a gap is present between the planar member 10 and the undersurface of the substrate W, thermal transfer to/from the substrate W is improved due to a decrease in thermal distance between a sensor/heater and the substrate W.

In one embodiment a temperature sensor 14 and/or heater 12 is applied to a top surface of the planar member 10. The sensor 14 and/or heater 12 may be encapsulated by a coating, for example an electrically insulating coating. Any sensor/heater may be applied on an insulating coating or layer.

A bottom surface of the planar member 10 and/or resilient member 30 may have an electrically insulating layer on it.

Figure 4:
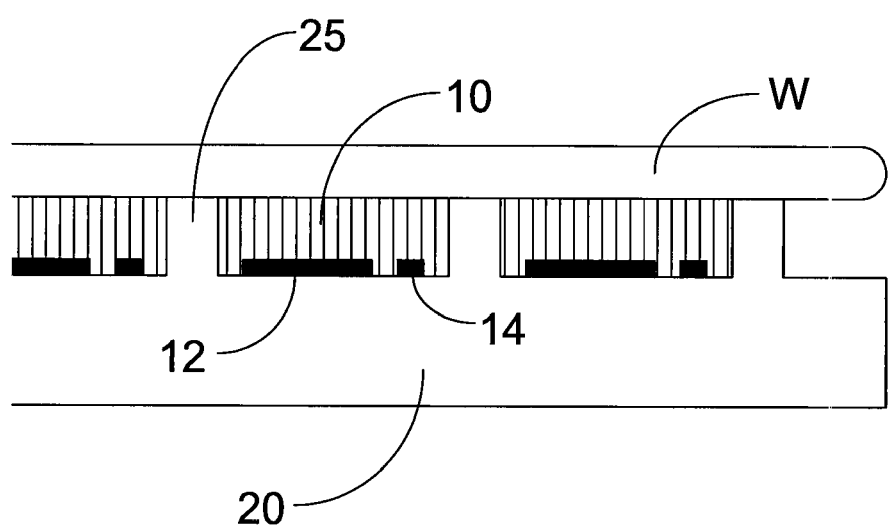
FIG. 4 depicts, in cross-section, a burl plate and planar member, in plan.

FIG. 4 illustrates, in cross-section, a further embodiment. In the FIG. 4 embodiment the planar member 10 comprises a plurality of carbon nanotubes. Carbon nanotubes have a high thermal conductivity (greater than 1000 $Wm^{-1}K^{-1}$). Therefore a sensor/heater can be provided in the planar member 10 away from the undersurface of the substrate W. For example, the heater/sensor can be provided on a surface of the planar member 10 which faces away from the undersurface of the substrate W.

In an embodiment the carbon nanotubes are grown carbon nanotubes. In an embodiment an axis of the carbon nanotubes is substantially perpendicular to a surface of the burl plate 20 and/or substrate W. The thermal conductivity of carbon nanotubes is much greater along their axis than across their axis.

The carbon nanotubes may be made such that when the substrate W is not positioned on the burl plate 20 they project above the plane of the top surface of the burls 25. When the substrate W is then clamped to the burl plate 20, the carbon nanotubes bend or compress. In this way the carbon nanotubes can be made to press into contact with the undersurface of the substrate W and further improve thermal contact. In an embodiment the length of the carbon nanotubes is such that a gap is present between the top of the planar member 10 and the undersurface of the substrate W.

In an embodiment a coating is provided on the top surface of the planar member 10. The coating may be of an electrically insulating material (for example in the case of the substrate table WT being an electrostatic clamp) and/or may be in the form of a coating to reduce the abrasion of the planar member 10 on the undersurface of the substrate W. Carbon nanotubes are extremely hard and therefore may damage the undersurface of the substrate W. This may deleteriously lead to the generation of contaminant particles. By providing a coating which reduces this damage (for example a coating which is softer than the carbon nanotubes) a possible disadvantage of this embodiment may be mitigated. The coating should desirably have a high co-efficient of thermal conductivity. An example coating is gold (because it is soft and has a thermal conductivity of 315 $Wm^{-1}K^{-1}$).

In an embodiment the planar member 10 has a thermal conductivity of at least 200 $Wm^{-1}K^{-1}$ or at least 1000 $Wm^{-1}K^{-1}$. In an embodiment, the thermal conductivity is at least 2000, 3000 or 5000 $Wm^{-1}K^{-1}$. This helps ensure the aim of achieving better thermal transfer.

In an embodiment the carbon nanotubes are grown in place on the burl plate 20 on the surface between the burls 25. In an embodiment the carbon nanotubes are formed as part of a removable member so that the planar member 10 is removable from the burl plate 20. The nanotubes may be grown by any technique for example by CVD, arc discharge, laser ablation, high pressure carbon monoxide (HIPco), etc.

The carbon nanotube layer may be realized in any known way between two plates (in this case between the burl plate 20 with a semi-conductive deposit and a substitute substrate W in place on the burl plate 20 to control the length of the carbon nanotubes and so help prevent the need for further processing steps).

A planar member 10 comprising carbon nanotubes can be produced using a similar scheme to that described above except that the planar member 10 need not be produced on a burl plate 20 in a lithographic apparatus. Instead the carbon nanotubes could be produced on a different (dummy) burl plate 20, optionally on which a substrate layer has been placed on the surface of the burl plate 20 between the burls 25, on top of which is a semi-conductive deposit which will then be grown into the carbon nanotubes. The sensor/heater combination can be provided on top of the substrate prior to growing of the carbon nanotubes.

In an embodiment multiple sensing tracks 14 are provided for each heating track 12. This can result in an increase in yield as a certain amount of defective sensing tracks 14 can be accommodated.

In an embodiment, the planar member 10 is provided purely for its mechanical properties. That is, the planar member 10 is mounted on the first object to support a second object between supporting points (e.g. burls 25) of the first object. In the embodiment when the first object is a burl plate 25, the planar member 10 supports the substrate at positions between burls 25.

In an embodiment the carbon nanotubes have a density of between $10^4/mm^2$-$10^{10}/mm^2$. In an embodiment the density of carbon nanotubes varies, in plan. This may be advantageous because it is then possible to obtain locally varying mechanical specifications (e.g. stiffness properties) with a single material.

In an embodiment the heater 12 and/or sensor 14 is manufactured (grown) of carbon nanotubes. This results in a beneficial increase in conductivity and as such resolution.

In an embodiment, there is provided a lithographic apparatus arranged to transfer a pattern from a patterning device onto a substrate, comprising a member to improve thermal transfer to/from an object. In an embodiment, the member is planar. In an embodiment, the member has a thermal conductivity of at least 200 $Wm^{-1}K^{-1}$. In an embodiment, the member is removable. In an embodiment, the member is mounted on a first object and the object to/from which thermal transfer is improved is a second object. In an embodiment, the lithographic apparatus further comprises the second object. In an embodiment, the second object is a lens or a table. In an embodiment, the second object is a substrate or a mask. In an embodiment, the member is mounted to a burl plate. In an embodiment, the burl plate is an electrostatic burl plate. In an embodiment, the burl table is an underpressure burl plate. In an embodiment, the member comprises a plurality of through openings through which burls of the burl plate project. In an embodiment, the lithographic apparatus comprises a gap between the member and the object. In an embodiment, the lithographic apparatus further comprises a foam substrate between the first object and the member. In an embodiment, the foam is an open cell foam. In an embodiment, the foam is a closed cell foam. In an embodiment, the foam has a Young's modulus of less than 8,000 MPa. In an embodiment, in use, the member is pressed into contact with the object. In an embodiment, the member is pressed into contact with the object due to the elasticity of a member and the object being brought into close proximity to the member thereby to compress the member. In an embodiment, the member comprises a heater and/or a temperature sensor. In an embodiment, the lithographic apparatus further comprises a driver to alternately drive a conducting path of the member as a heater and as a temperature sensor. In an embodiment, the member comprises carbon nanotubes. In an embodiment, an axis of the carbon nanotubes is substantially perpendicular to a surface of the object. In an embodiment, the lithographic apparatus further comprises a coating on the carbon nanotubes to close and smooth an outer surface of the member. In an embodiment, the carbon nanotubes have a density which varies, in plan. In an embodiment, the member comprises a plurality of localized heaters. In an embodiment, the member comprises a plurality of localized temperature sensors. In an embodiment, the member has an insulating layer on a surface facing the object, or on a surface facing away from the object, or both.

In an embodiment, there is provided a lithographic apparatus arranged to transfer a pattern from a patterning device onto a substrate, the lithographic apparatus comprising: a first object; and a plurality of carbon nanotubes extending towards the first object with an axis substantially aligned with a direction perpendicular to a surface of the first object to improve thermal transfer to/from the first object.

In an embodiment, the lithographic apparatus further comprises a localized heater, the plurality of carbon nanotubes being positioned between the localized heater and the first object. In an embodiment, the lithographic apparatus further comprises a plurality of localized temperature sensors, the plurality of carbon nanotubes being positioned between the localized temperature sensors and the first object. In an embodiment, the plurality of carbon nanotubes are attached to a burl table. In an embodiment, the first object is a lens. In an embodiment, the first object is a substrate. In an embodiment, when the first object is mounted on a second object and at least some of the plurality of carbon nanotubes touch the first object. In an embodiment, those carbon nanotubes in contact with the second object are bent. In an embodiment, the lithographic apparatus further comprises a coating on the plurality of carbon nanotubes such that the first object contacts the coating and the coating is between the carbon nanotubes and the first object. In an embodiment, the lithographic apparatus comprises a gap between the carbon nanotubes and the first object.

In an embodiment, there is provided a removable member to improve thermal transfer to/from an object of, or in, a lithographic apparatus, the removable member comprising a heater and a temperature sensor. In an embodiment, the member is planar. In an embodiment, the removable member further comprises a plurality of localized heaters and/or a plurality of localized temperature sensors. In an embodiment, the removable member comprising a plurality of through holes. In an embodiment, the through holes are sized and dimensioned so that the removable member can be placed on a burl table with burls projecting through the through holes. In an embodiment, the removable member has a thickness less than the height of the burls. In an embodiment, the removable member has a thickness substantially equal to the height of the burls. In an embodiment, the removable member further comprises a substrate. In an embodiment, the substrate is deformable and has a Young's modulus of less than 8000 MPa. In an embodiment, the substrate is a foam. In an embodiment, the substrate comprises a plurality of carbon nanotubes. In an embodiment, the plurality of carbon nanotubes have an axis substantially perpendicular to a plane of the member. In an embodiment, the removable member has a thermal conductivity of greater than 200 Wm$^{-1}$K$^{-1}$ in a direction substantially perpendicular to a major planar surface of the removable member.

In an embodiment, there is provided a lithographic apparatus comprising a removable member as described herein. In an embodiment, the lithographic apparatus described herein further comprises: a support constructed to support a patterning device, the patterning device being capable of imparting a radiation beam with a pattern in its cross-section to form a patterned radiation beam; a substrate table constructed to hold a substrate; and a projection system configured to project the patterned radiation beam onto a target portion of the substrate.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus arranged to transfer a pattern from a patterning device onto a substrate, the lithographic apparatus comprising:
   a burl plate having a plurality of burls, the plurality of burls configured to support a lower surface of a substrate;
   a condition system configured to thermally condition the substrate, the condition system located on or over a top surface of the burl plate and located between the plurality of burls; and
   a thermally conductive solid material between the plurality of burls, the material configured to improve thermal transfer between the burl plate and the substrate and the material overlying and/or laterally contacting the condition system.

2. A lithographic apparatus comprising
   a movable table;
   a burl plate having a plurality of burls, the plurality of burls configured to support a lower surface of an object; and
   a removable member located between the plurality of burls and configured to improve thermal transfer to and/or from the object, the removable member comprising a thermally conductive solid material and comprising a condition configured to thermally condition the object, the condition system comprising a heater and a temperature sensor.

3. The lithographic apparatus according to claim 1, wherein the condition system comprises a heater located between the plurality of burls.

4. The lithographic apparatus according to claim 3, wherein the heater is applied to the top surface of the material.

5. The lithographic apparatus according to claim 3, wherein the condition system comprises a plurality of heaters and a plurality of sensors, each of the plurality of heaters and the plurality of sensors is confined to a localized area, in plan, of the material.

6. The lithographic apparatus according to claim 1, wherein the material comprises a plurality of through-holes and each of the plurality of burls projects through the corresponding through-hole.

7. The lithographic apparatus according to claim 1, wherein a top surface of the material is substantially parallel with a top surface of each of the plurality of burls.

8. The lithographic apparatus according to claim 1, further comprising a resilient member located in the space between the plurality of burls and underneath the material.

9. The lithographic apparatus according to claim 8, wherein the material and/or the resilient member is dimensioned such that when the substrate is not in place on the burl plate, a top surface of the material projects above a top surface of each of the plurality of burls.

10. The lithographic apparatus according to claim 8, wherein the material and/or the resilient member is configured such that when the substrate is placed onto the plurality of burls and a clamping force is applied to the substrate, the elasticity of the material and/or the resilient member results in the top surface of the material being pressed into contact with the lower surface of the substrate.

11. The lithographic apparatus according to claim 8, wherein the resilient member comprises a foam substrate.

12. The lithographic apparatus according to claim 1, wherein the material comprises a plurality of carbon nanotubes extending between the burl plate and the lower surface of the substrate.

13. The lithographic apparatus according to claim 12, wherein the plurality of carbon tubes are made such that when the substrate is not positioned on the burl plate, the plurality of carbon nanotubes project above the plane of a top surface of each of the plurality of burls.

14. The lithographic apparatus according to claim 13, wherein the plurality of carbon nanotubes are configured such that when the substrate is clamped to the burl plate, the plurality of carbon nanotubes bend or compress such that the plurality of carbon nanotubes press into contact with the lower surface of the substrate.

15. The lithographic apparatus according to claim 12, further comprising a coating on a top surface of each of the plurality of carbon nanotubes, the coating being softer than the plurality of carbon nanotubes.

16. The lithographic apparatus according to claim 1, wherein the material is removable.

17. The lithographic apparatus according to claim 1, further comprising an electrically insulating layer on a surface facing the substrate, or on a surface facing away from the substrate, or both.

18. A device manufacturing method, comprising:
transferring a pattern from a patterning device onto a substrate;
supporting a lower surface of substrate using a plurality of burls of a burl plate, wherein a thermally conductive solid material located between the plurality of burls improves thermal transfer between the burl plate and the substrate; and
thermally conditioning the substrate using a condition system, the condition system located on or over a top surface of the burl plate and located between the plurality of burls, and the material overlying and/or laterally adjacent the condition system.

19. The method according to claim 18, wherein the condition system comprises a heater located between the plurality of burls.

20. The method according to claim 18, wherein the condition system comprises a plurality of heaters and a plurality of sensors, each of the plurality of heaters and the plurality of sensors is confined to a localized area, in plan, of the material.

21. The apparatus according to claim 3, wherein the condition system further comprises a sensor located between the plurality of burls.

* * * * *

UNITED STATES PATENT AND TRADEMARK OFFICE
CERTIFICATE OF CORRECTION

| | | |
|---|---|---|
| PATENT NO. | : 8,976,335 B2 | Page 1 of 1 |
| APPLICATION NO. | : 13/333237 | |
| DATED | : March 10, 2015 | |
| INVENTOR(S) | : Ruud Antonius Catharina Maria Beerens et al. | |

It is certified that error appears in the above-identified patent and that said Letters Patent is hereby corrected as shown below:

In the Claims, Column 12, Claim 2, Line 24
change "condition configured to thermally condition the object,"
to --condition system configured to thermally condition the object,--.

Signed and Sealed this
Sixteenth Day of June, 2015

Michelle K. Lee
*Director of the United States Patent and Trademark Office*